United States Patent
Huang et al.

(10) Patent No.: US 9,711,722 B2
(45) Date of Patent: Jul. 18, 2017

(54) METHOD FOR IMPROVING MASS-PRODUCTION YIELD OF LARGE-AREA ORGANIC SOLAR CELLS

(71) Applicant: INSTITUTE OF NUCLEAR ENERGY RESEARCH, ATOMIC ENERGY COUNCIL, EXECUTIVE YUAN, R.O.C., Taoyuan (TW)

(72) Inventors: Yu-Ching Huang, Taoyuan (TW); Hou-Chin Cha, Taoyuan (TW); De-Han Lu, Taoyuan (TW); Chih-Min Chuang, Taoyuan (TW); Zheng-Lin Yu, Taoyuan (TW); Chia-Te Yen, Taoyuan (TW); Yeong-Der Lin, Taoyuan (TW); Charn-Ying Chen, Taoyuan (TW); Cheng-Si Tsao, Taoyuan (TW)

(73) Assignee: Institute of Nuclear Energy Research, Atomic Energy Council, Executive Yuan, R.O.C., Taoyuan (TW)

( * ) Notice: Subject to any disclaimer, the term of this patent is extended or adjusted under 35 U.S.C. 154(b) by 0 days.

(21) Appl. No.: 14/969,056

(22) Filed: Dec. 15, 2015

(65) Prior Publication Data

US 2017/0170397 A1    Jun. 15, 2017

(51) Int. Cl.
*H01L 21/00* (2006.01)
*H01L 51/00* (2006.01)
*H01L 51/42* (2006.01)

(52) U.S. Cl.
CPC ...... *H01L 51/0003* (2013.01); *H01L 51/0026* (2013.01); *H01L 51/424* (2013.01); *H01L 51/005* (2013.01); *H01L 51/0036* (2013.01); *H01L 51/0047* (2013.01)

(58) Field of Classification Search
CPC .......... H01L 2031/0344; H01L 31/032; H01L 51/4253; H01L 51/0032; H01L 51/0037; H01L 51/0043
See application file for complete search history.

(56) References Cited

U.S. PATENT DOCUMENTS

| | | | | |
|---|---|---|---|---|
| 2013/0247993 A1* | 9/2013 | Gong | ...................... | H01L 51/426 136/263 |
| 2014/0026948 A1* | 1/2014 | Ihn | ....................... | H01L 51/4246 136/255 |
| 2014/0131868 A1* | 5/2014 | Kippelen | .................. | H01B 1/24 257/741 |
| 2014/0256081 A1* | 9/2014 | Hammond | ........... | H01L 51/4253 438/82 |

(Continued)

Primary Examiner — Zandra Smith
Assistant Examiner — John M Parker
(74) Attorney, Agent, or Firm — Rosenberg, Klein & Lee

(57) ABSTRACT

The present invention discloses a method for improving mass-production yield of large-area organic solar cells for forming the active layer using the roll-to-roll process. The active layer includes low-bandgap high-polymer PTB7, Fullerenes derivative $PC_{71}BM$, and high-boiling-point additives. The addition of the high-boiling-point additives can enhance the efficiency of organic solar cells effectively. In the roll-to-roll process according to the present invention, the drying temperature for the wet film is controlled for controlling the content of additives in the dry film. Thereby, the stability of the overall mass production and the device yield can be both improved.

5 Claims, 1 Drawing Sheet

(56) References Cited

U.S. PATENT DOCUMENTS

| | | | |
|---|---|---|---|
| 2015/0179965 A1* | 6/2015 | Lee | H01L 27/302 |
| | | | 136/256 |
| 2015/0243444 A1* | 8/2015 | Irwin | H01G 9/2027 |
| | | | 136/261 |
| 2016/0064672 A1* | 3/2016 | Lee | H01L 51/0021 |
| | | | 257/40 |

* cited by examiner

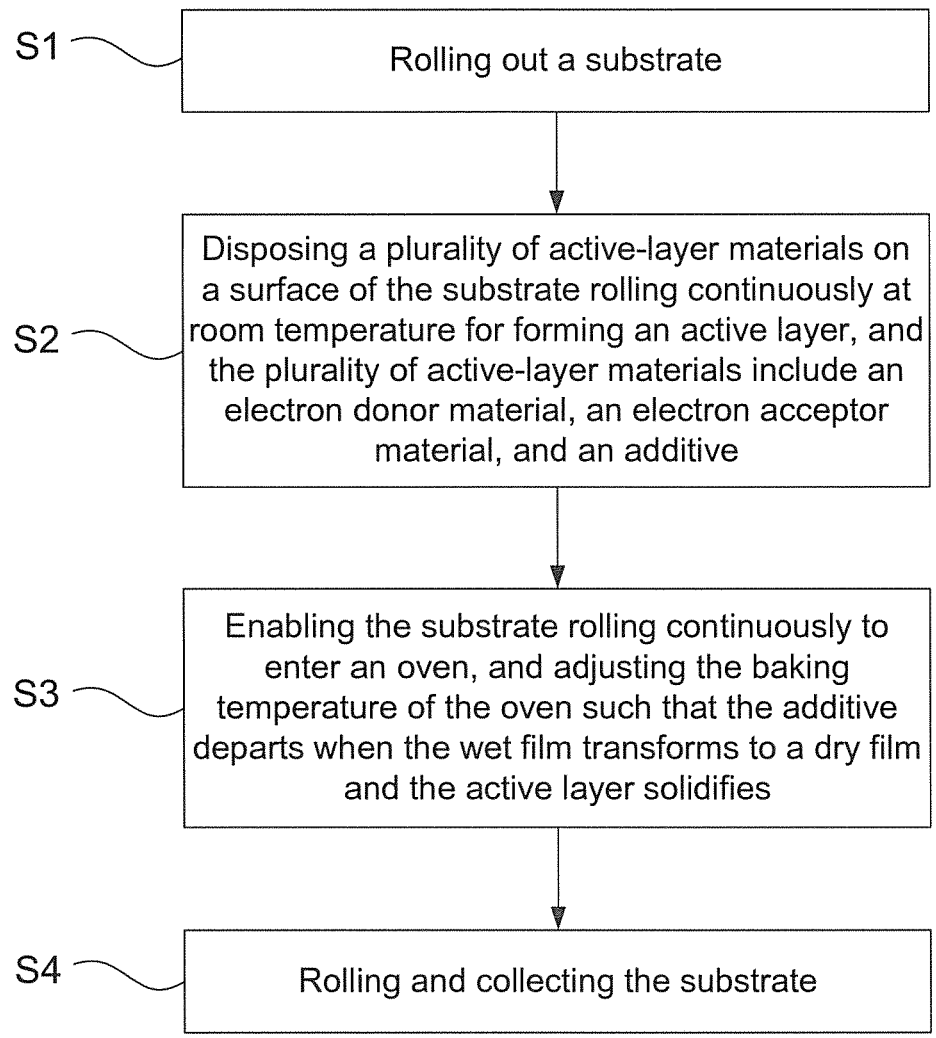

METHOD FOR IMPROVING MASS-PRODUCTION YIELD OF LARGE-AREA ORGANIC SOLAR CELLS

FIELD OF THE INVENTION

The present invention relates to a method for improving the mass-production yield of large-area processes, and particularly to a method for improving the mass-production yield of large-area organic solar cells, in which no long thermal treatment, high vacuum, or extra process is required for the active layer of the organic solar cells.

BACKGROUND OF THE INVENTION

Energy shortage is a critical issue to be solved in the future. Currently, the major countries in the world are seeking actively renewable energy sources such as solar energy or wind energy to replace traditional petrochemical fuels. In particular, thanks to its advantages of inexhaustible supply and safety, because no waste is produced during the power generation, the solar technology has become the key industry to which the major industrial countries worldwide have invested massive researches.

Among solar cell technologies, due to their advantages of simple fabrication processes, low cost, perviousness to light, and integrable with flexible substrates, organic solar cells are valued increasingly.

In order to reduce the cost of organic solar cells, there is a technology presently for fabricating large-area organic solar cells. The technology abandons the technique of spin coating for preparing solar cell thin films. Instead, large-area processes, such as spray coating or roll-to-roll (R2R) coating, are adopted. Currently, for preparing organic solar cells, the wet process is mostly adopted, in which the material for the active layer is first dissolved in a solvent for forming an active layer solution. Then spin coating or roll-to-roll coating is adopted to form the active layer. In recent years, the efficiency of organic solar cells increases substantially. This is attributed to the maturity of the novel synthesis technology for low-bandgap polymers. Nonetheless, in the system using low-bandgap polymers as the active layer, in order to enable the devices in the system to have superior power conversion efficiency, different additives with high boiling point, such as DIO, CN, or NMP, are normally added to the active layer solution. By doing so, the active layer can have better internal nanometer structures, electron donor and acceptor materials are separated appropriately, and the conductive high-polymer crystals are superior and hence facilitating absorption of photons, separation of excitons, and conduction and collection of charges. Consequently, superior power conversion efficiency is achieved.

The method for fabricating organic solar cells according to the prior art is spin coating. This method can dry the wet film in a short time. In the system having high-boiling-point additives, due to rapid film forming, the residual high-boiling-point additives in the dry film differ. These residual high-boiling-point additives affect the stability of the efficiency of organic solar cells. That is to say, the production yield is inferior. In addition, residual additives also affect significantly the lifetime of devices. Accordingly, how to remove the additives has become an emphasis of process improvement.

The methods for removing residual additives according to the prior art include spin coating an extra layer of alcohol solvent. By taking advantage of high solubility of the additives in alcohol, the residual additives can be removed. Alternatively, long-term heating at temperatures (80~100° C.) higher than room temperature facilitates vaporization of the additives from films. Besides, there is also a technique of drawing out the additives in a high vacuum method. These methods require either long-term process or additional processes to reduce the residual additives. These impose a serious limitation on commercial mass production.

On the other hand, in the roll-to-roll mass-production processes, owing to much slower rate of film forming compared with spin coating, the residual additives in active layers are much greater than those in the traditional spin coating process. In addition, because the roll-to-roll process is a continuous process, films must be dried before they are rolled, otherwise they will be damaged. Thereby, the films should pass through an oven set at a fixed temperature. Nonetheless, the influence of the baking temperature on residual additives for the current fixed-temperature drying technique on roll-to-roll organic solar cells using an oven is still unclear; the influence of the drying temperature of films on efficiency and yield is unknown as well. Consequently, the yields for different batches of products vary and the stability of product quality is affected.

Accordingly, an appropriate roll-to-roll mass-production process can control the residual additives and improve the overall large-area production yield. In order to realize commercialization of organic solar cells in the future, an appropriate roll-to-roll mass-production process plays a key role.

SUMMARY

An objective of the present invention is to provide a method for improving mass-production yield of large-area organic solar cells, which is applicable to sheet-to-sheet or roll-to-roll large-area roll-type mass production. The method uniquely changes the temperature control condition for drying large-area films. Thereby, the stability of the quality of active layers can be enhanced; the production yield can be improved; and the device lifetime can be extended.

Another objective of the present invention is to provide a method for improving mass-production yield of large-area organic solar cells, in which specific additives are added to the active-layer materials. Thereby, the efficiency of organic solar cells can be enhanced. The large-area process is changed significantly. In particular, the power consumption for fabrication is lowered, making the method more competitive.

Still another objective of the present invention is to provide a method for improving mass-production yield of large-area organic solar cells, which adopts 1,8-diiodooctane as the additive. The temperature for the roll-to-roll process is further controlled for better matching the large-area process.

In order to achieve the above objectives, the present invention discloses a method for improving mass-production yield of large-area organic solar cells, which comprises steps of rolling out a substrate; disposing a plurality of active-layer materials on a surface of the substrate rolling continuously at room temperature for forming an active layer, and the plurality of active-layer materials include an electron donor material, an electron acceptor material, and an additive; enabling the substrate rolling continuously to enter an oven, and adjusting the baking temperature of the oven such that the additive departs when the wet film transforms to a dry film and the active layer solidifies; and rolling and collecting the substrate. Besides, the additive is 1,8-diiodooctane.

BRIEF DESCRIPTION OF THE DRAWINGS

The FIGURE shows a flowchart of the method according a preferred embodiment of the present invention.

DETAILED DESCRIPTION

In order to make the structure and characteristics as well as the effectiveness of the present invention to be further understood and recognized, the detailed description of the present invention is provided as follows along with embodiments and accompanying FIGURES.

Please refer to the FIGURE. The method for improving mass-production yield of organic solar cells according to the present invention comprises steps of:

Step S1: Rolling out a substrate;
Step S2: Disposing a plurality of active-layer materials on a surface of the substrate rolling continuously at room temperature for forming an active layer, and the plurality of active-layer materials includes an electron donor material, an electron acceptor material, and an additive;
Step S3: Enabling the substrate rolling continuously to enter an oven, and adjusting the baking temperature of the oven such that the additive departs when the wet film transforms to a dry film and the active layer solidifies; and
Step S4: Rolling and collecting the substrate.

In the above steps, the active layer according to the present invention is fabricated in large area, such as spray coating, scrape coating, roll-type slit coating, immersion coating, spray printing, screen printing, or flat printing. In particular, the method according to the present invention adopts roll equipment, which includes rolling out and rolling and collecting mechanisms. In addition, the active layer is formed during the dynamic rolling process.

The rolled-out substrate as indicated in the step S1 is flexible, enabling it to be used in roll-to-roll or sheet-to-sheet processes. Before the active-layer materials are disposed on the substrate, indium-tin-oxide can be first disposed by deposition and become a transparent conductive layer on the surface of the substrate. Thereby, the active-layer materials are disposed on the transparent conductive layer, which can be used as the cathode of the organic solar cells.

In addition to the electron donor material and the electron acceptor material, the active-layer materials according to the present invention further adopt 1,8-diiodooctane as the additive. As the concentration of the additive becomes higher, the process temperature is adjusted higher accordingly. According to a preferred embodiment of the present invention, the concentration of the additive is 0.2~3 wt %. The function of the additive is to form a preferred internal nanometer structure as well as enhancing crystallization of conductive high polymers. Thereby, the ability of absorbing light is increased and charge transport is facilitated. Consequently, the operating efficiency of the active layer of the organic solar cells is enhanced. This is the general purpose for adding additives in active layers.

Because in the roll-to-roll or sheet-to-sheet large-area roll-type process, the substrate is maintained in the state of continuous rolling, the step S4 is required for rolling and collecting. Thereby, the liquid active-layer materials must solidify after being disposed on the substrate and before being rolled and collected. The technique is to provide heat to dry and solidify the active layer. According to the present invention, the oven is adopted to provide heat to the active layer. Hence, the additives can depart by the heating of the oven during the process of transforming from a wet film to a dry one. In addition, the dose of the additives might differ. The temperature should be adjusted according to the usage of the additives, so that the residual additives in the solidified active layer can be maintained at a stable value. This can avoid variations in product quality among different batches.

An active layer has been formed on a surface of the rolled and collected substrate as described above. Subsequent processes can be performed to form a hole transport layer and an anode on the active layer, and thus completing preparation of organic solar cells. The material of the hole transport layer vary. It can be the mixture of poly(3,4-ethylenedioxythiophene) (PEDOT) and poly(styrenesulfonate) (PSS). Alternatively, it can be materials such as vanadium oxide ($V_2O_5$) and molybdenum oxide ($MoO_3$). The hole transport layer is used for assisting hole transport. The material of the anode is the most stable silver (Ag).

According to a preferred embodiment, 2 wt % 1,8-diiodooctane is chosen as the additive added to low-bandgap high-polymer PTB7 and the Fullerenes derivative $PC_{71}BM$ as the active-layer solution. In addition, the roll-to-roll process temperature is set to 130° C. By experiment, the above conditions can give superior device efficiency. Moreover, the production yield can be improved substantially.

To sum up, the present invention disclose a method for improving mass-production yield of large-area organic solar cells, which can fabricate a large-area active layer of organic solar cells by dynamically heating roll-to-roll processes. The active layer formed according to the present invention has excellent operating efficiency; the large-area mass-production process also improves the yield effectively. Considering product efficiency and yield improvement, the present invention undoubtedly provides a valuable method for improving mass-production yield of large-area organic solar cells.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A method for improving mass-production yield of large-area organic solar cells comprising steps of:
    rolling out a substrate;
    disposing a plurality of active-layer materials on a surface of said substrate rolling continuously at room temperature for forming an active layer, and said plurality of active-layer materials include an electron donor material, an electron acceptor material, and an additive;
    enabling said substrate rolling continuously to enter an oven, and adjusting a baking temperature of said oven such that said additive departs when the wet film transforms to a dry film and said active layer solidifies; and
    rolling and collecting said substrate;
    where said additive is 1,8-diiodooctane;
    wherein said baking temperature of said oven is adjusted dynamically between 70 and 150° C.

2. The method for improving mass-production yield of large-area organic solar cells of claim 1, wherein the concentration of said additive is between 0.2 and 3 wt %.

3. The method for improving mass-production yield of large-area organic solar cells of claim 1, wherein said electron material is PTB7 and said electron acceptor material is [6,6]-phenyl-C71 butyric acid methyl ester.

4. The method for improving mass-production yield of large-area organic solar cells of claim 1, and before disposing said plurality of active-layer materials on said substrate, further comprising a step of disposing a transparent conductive layer on said surface of said substrate so that said plurality of active-layer materials are disposed on said transparent conductive layer.

5. The method for improving mass-production yield of large-area organic solar cells of claim 1, wherein said step of adjusting said baking temperature of said oven is achieved by a heating plate disposed in said oven for supplying heat dynamically to said substrate.

* * * * *